United States Patent [19]

Weinberg

[11] Patent Number: 4,694,206

[45] Date of Patent: Sep. 15, 1987

[54] DRIVE CIRCUIT FOR A POWER FIELD EFFECT TRANSISTOR

[75] Inventor: Alan H. Weinberg, Sassenheim, Netherlands

[73] Assignee: Agence Spatiale Europeenne, Paris, France

[21] Appl. No.: 680,952

[22] Filed: Dec. 11, 1984

[30] Foreign Application Priority Data

Dec. 14, 1983 [FR] France ................... 83 20726

[51] Int. Cl.[4] ............ H03K 17/04; H03K 17/08; H03K 17/687
[52] U.S. Cl. .................... 307/571; 307/270; 307/584; 307/246
[58] Field of Search ............... 307/264, 270, 475, 290, 307/279, 450, 451, 576, 579, 585, 605, 246, 571; 365/104, 226

[56] References Cited

U.S. PATENT DOCUMENTS

| | | | |
|---|---|---|---|
| 3,586,883 | 6/1971 | Hayes | 307/270 X |
| 4,423,341 | 12/1983 | Shelly | 307/270 X |
| 4,461,966 | 7/1984 | Hebenstreit | 307/270 X |
| 4,511,815 | 4/1985 | Wood | 307/279 X |
| 4,565,931 | 1/1986 | Fumey | 307/270 X |
| 4,575,642 | 3/1986 | Hochreutiner et al. | 307/270 X |

FOREIGN PATENT DOCUMENTS

| | | | |
|---|---|---|---|
| 158850 | 12/1979 | Japan | 307/270 |
| 111434 | 2/1983 | Japan | 307/450 |
| 25721 | 2/1983 | Japan | 307/584 |
| 136137 | 8/1983 | Japan | 307/584 |

Primary Examiner—Stanley D. Miller
Assistant Examiner—David R. Bertelson
Attorney, Agent, or Firm—Spencer & Frank

[57] ABSTRACT

Two switching circuits are connected between the gate and the source electrode of a field effect transistor, each of said circuits comprising a controlled switch and a secondary winding of a pulse transformer. A first pulse generator produces at a predetermined rate a pulse having a first logic state for driving the controlled switch of a first of said switching circuits, said pulse being applied to a transformer primary winding, and a second pulse generator produces at a predetermined rate a pulse having a second logic state which is complementary to the logic state of the pulse produced by the first pulse generator, for driving the controlled switch of the second switching circuit, each primary winding being magnetically coupled with a secondary winding.

9 Claims, 4 Drawing Figures

DRIVE CIRCUIT FOR A POWER FIELD EFFECT TRANSISTOR

BACKGROUND OF THE INVENTION

In some applications of switching field effect transistors (FET) such as in high frequency switching converters or regulators, it is necessary to isolate the FET's control circuit, operating at a low voltage level, from the switching circuit of which the FET forms part, operating at a high voltage level, by means of a drive circuit.

In the case of space applications such a drive circuit should allow the FET's gate to be biased negatively with respect to its source in the "off" condition, since otherwise the ionizing radiation of the space environment could provoke the FET to switch on. Such negative gate bias also prevents switching of the FET in case of randomly occurring step voltages applied to the gate.

It is further required that for switching converters or regulators, the drive circuit's delay time in switching the FET "on" or "off" should be very short, i.e. in the order of 0.05 microsecond.

Finally, such a drive circuit should allow a zero to 100% duty cycle when driven by pulse width modulated signals, i.e. it should allow the FET to be switched fully "on" or "off" for an indefinite period of time.

DESCRIPTION OF THE PRIOR ART

A component frequently used for electrical isolation between control and power circuits during the last years is the optocoupler. Here, the electrical signal from a transistor (e.g. GaAs-LED) is converted into an optical one, which then is carried along an optical path to a receiver (e.g. silicon phototransistor), which reconverts the optical signal into an electrical one. Another, more recent, possibility is to drive a power switch with a piezocoupler. A piezocoupler is a ceramic component in which the electrical energy is converted into mechanical energy and carried further as an acoustic wave which is recovered at the output into an electrical signal.

Both known methods have as a major disadvantage that their speed of operations is too slow for use in switching converters or regulators. The delay time in switching "on" or "off" is typically of the order of 20 microseconds. A second disadvantage is that the methods require the use of auxiliary equipment such as a potential-free power supply (optocoupler) and a multivibrator (piezocoupler). Neither of these methods allows a negative gate-source turn-off voltage to be realized for the switching FET.

A more conventional method for electrical isolation is the use of a pulse transformer. Control information is transmitted by electromagnetic induction from one circuit having a certain potential to the other having another energy level. The transformers can only transfer to the secondary AC components of the input signal. Consequently, their output voltage swings from negative to positive by an amount that changes with the duty cycle. Furthermore, the leakage inductance of the transformer reduces its effectiveness as a gate drive circuit. To overcome these difficulties, a signal conditioning stage may be necessary, which requires a separate power supply and therefore more complexity. The pulse transformer however remains a reliable approach with high noise immunity, whenever the duty cycle has a fixed known minimum. Although the pulse transformer as such is the most practical means to provide an electrical isolation between the FET's control circuit and the FET switching circuit, it does not in all respects satisfy the requirements of the FET drive circuit outlined above.

SUMMARY OF THE INVENTION

To overcome the drawbacks of the prior art, the invention provides a drive circuit for a power field effect transistor comprising two switching circuits which are connected between the gate and source electrode of a field effect transistor, each of said circuits comprising a controlled switch and a secondary winding of a pulse transformer, a first pulse generator for producing at a predetermined rate a pulse having a first logic state for driving the controlled switch of a first of said switching circuits, said pulse being applied to a transformer primary winding, and a second pulse generator for producing at a predetermined rate a pulse having a second logic state which is complementary to the logic state of the pulse produced by the first pulse generator, for driving the controlled switch of the second switching circuit, each primary winding being magnetically coupled with a secondary winding.

The primary and secondary windings of the switching circuits can be wound on a same or on separate transformers. In a first embodiment the primary winding are two windings of the same transformer and the secondary windings are comprised of a single secondary winding on the said transformer. The latter can further be provided with two auxiliary secondary windings, each of which being connected to drive the switch in a respective switching circuit.

In another embodiment, the primary and secondary windings are provided on two transformers with the secondary windings being connected serially. An auxiliary secondary winding can further be provided on each transformer to drive the switch in a respective switching circuit.

DESCRIPTION OF EXEMPLARY EMBODIMENTS

Figure 1:
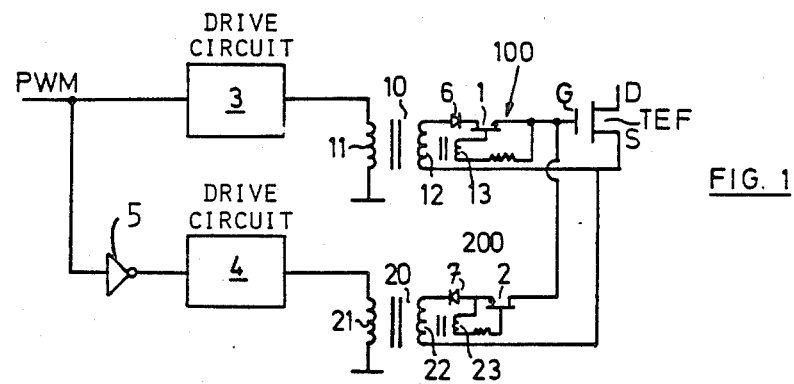
FIG. 1 is a circuit diagram of a first embodiment of the drive circuit according to the invention.

Now referring to FIG. 1 there is shown a circuit configuration according to the invention comprising two switching circuits 100 and 200 connected between the gate G and source S of the power field effect transistor TEF to be controlled. The switching circuits include each a controlled switch, 1 and 2 respectively, diodes 6 and 7 respectively and a secondary winding of a pulse transformer, 10 and 20 respectively. Each pulse transformer couples one of said switching circuits to a drive circuit 3, 4 connected to the primary winding of the transformer. The switches 1 and 2 are controlled synchronously through auxiliary secondary windings 13, 23 on the pulse transformers 10 and 20.

The circuit of FIG. 1 operates as follows. When the drive circuit 3 applies a pulse to the primary 11 of transformer 10, a positive voltage is produced at the secondary windings 12 and 13: the transistor 1 is turned ON by the voltage applied to its base through the winding 13 and the voltage across the winding 12 charges up the FET's gate-source capacitance to the open circuit source voltage of the pulse transformer 10. The FET is thereby turned ON.

At the termination of the ON pulse after, say, 0.5 microsecond, the transistor 1 will turn OFF, leaving the gatesource capacitance charged to its high value and therefore the TEF in its ON state, even if there is a leakage of the charge on said capacitance. If the drive pulse is then repeated after intervals of, say, 10 microseconds, the FET can be maintained in the ON state for an indefinite time period since these pulses will "refresh" the charge on said gate-source capacitance.

In order to turn the FET to its OFF state, the circuit associated with the pulse transformer 20 is used. When the drive circuit 4 energizes the primary winding 21, a negative voltage now charges up the gate-source capacitance of the FET which then turns OFF. The negative drive pulse can be repeated after intervals of, say, 10 microseconds, to maintain the FET in the OFF state.

Figure 2:
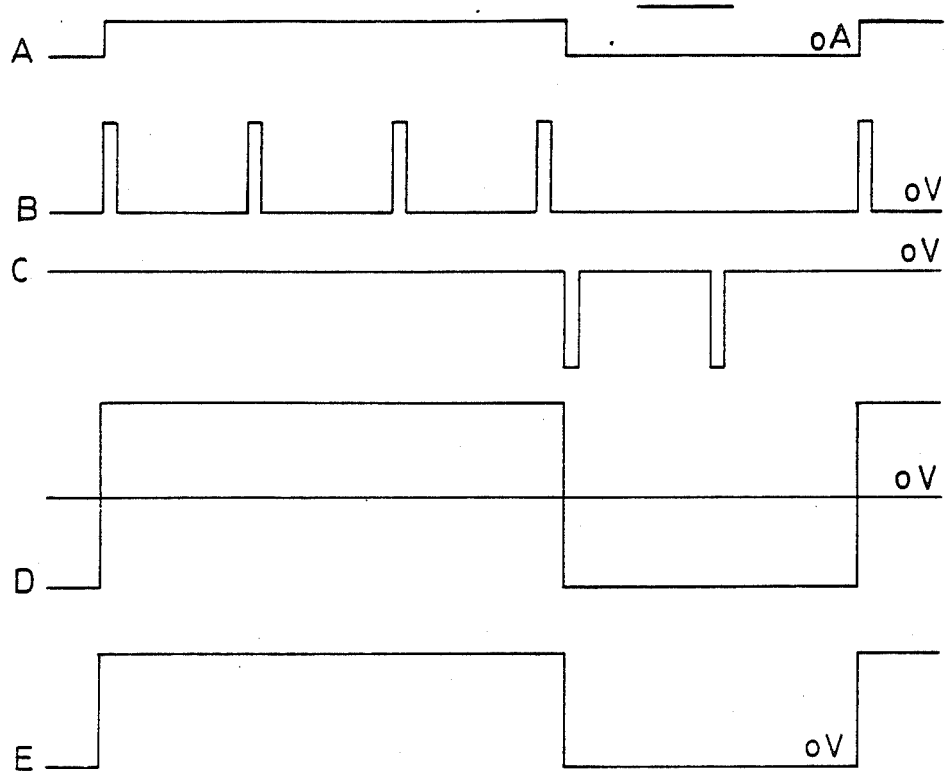
FIG. 2 is a diagram showing the signal waveforms at some points in the circuit of FIG. 1.

In the embodiment of FIG. 1, the drive pulse sequences are derived from a pulse width modulated signal (PWM) through two identical pulse generators 3 and 4 which produce a pulse with a mark-to-space ratio of about 1:20 i.e. the pulse is high (logic 1) for about 0.5 microsecond and low (logic zero) for 10 microseconds. The logic inside these generators is such that the first pulse at their output appears within a few nanoseconds of an input logic 1 being applied to its input and any output pulse is terminated (logic zero) within a few nanoseconds of the input going to a logical zero. This together with a logic inverter 5 ensures that the outputs of generators 3 and 4 are complementary and there is no possibility of both generators having a logic 1 at their outputs at the same time. When the PWM pulse is a logic 1, then the generator 3 produces a pulse at its output to turn the FET on. When the PWM pulse goes to a logic zero, the generator 3 is switched off and the generator 4 is switched on, producing a negative gate-source voltage and therefore switching the power FET to OFF. FIG. 2 shows the waveforms of some pulses and signals in the circuitry of FIG. 1.

The diagram A shows the waveform of the PWM input signal, the diagram B shows the waveform of the ON pulse at the secondary 12 of the pulse transformer 10, the diagram C shows the waveform of the OFF pulse at the secondary 22 of the pulse transformer 20, the diagram D shows the waveform of the gate signal at the FET, the diagram E shows the waveform of the drain current of the FET.

The drive circuit as described above has the following advantages:

1. Electrical isolation between the control electronics and the power switching circuit of the FET, due to the use of transformers, an advantage as known in the prior art.
2. The drive circuit provides a negative gate-source voltage during the OFF period, thereby improving the radiation resistance of the power FET, and in addition improving its voltage breakdown characteristic. This negative gate-source voltage is achieved without the need for complex auxiliary equipment. A further advantage of the negative gate bias is that it prevents switching of the FET when random step voltages are applied to the gate (dV/dt capability).
3. For pulse width modulation of the power FET, the duty cycle can be from zero to 100%, i.e. from completely ON to completely OFF.
4. The ON or OFF condition can be maintained for an indefinite period of time due to the use of pulse sequences to "refresh" the FET's gate-source capacitance charge.
5. The power consumption of the drive circuit can be very low.
6. The delay time in switching the field effect transistor ON or OFF can be very short, typically 0.05 microsecond, since the FET's source resistance can be made low (RC time constant).

Figure 3:
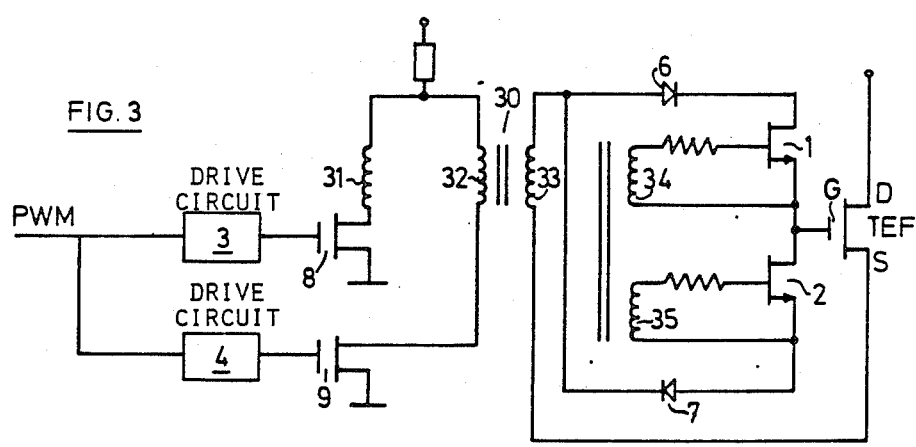
FIG. 3 is a circuit diagram of a second embodiment of the drive circuit according to the invention.

Referring to FIG. 3 there is shown an embodiment which is more advantageous in that it makes use of only one pulse transformer. This transformer 30 has two primaries 31 and 32, a main secondary winding 33 and two auxiliary secondary windings 34 and 35 connected as shown in the drawing. The secondaries 34 and 35 serve the same function as the secondaries 13 and 23 in FIG. 1 and they are associated with the transistors 1 and 2. When transistor 8 is switched ON, a step voltage appars at the secondary windings 33, 34 and 35. The positive voltage at the secondary 34 turns ON the transistor 1 and allows the positive step voltage from the secondary 33 to charge up the gate-source capacitance of the power FET through the diode 6 and turn it ON. When the transistor 8 is turned OFF (after 0.5 microsecond), the transistor 1 turns off (no base voltage), but the gate-source capacitance remains charged so that the FET remains ON. The pulse is repeated at approximately 10 microsecond intervals to keep the FET on. This is necessary because of the leakage discharge of the gate-source capacitance.

To switch off the power FET, the transistor 9 is switched ON and a step voltage appears on all the windings of the transformer 30 but now having a negative polarity. The transistor 2 therefore receives a base voltage and turns ON, thus allowing the transistor 2 to charge the gate-source capacitance of the FET in the negative direction through the diode 7, and switching the FET on. When the transistor 9 switches off after 0.5 microsecond, the transistor 2 is also switched OFF (no base voltage) so that the gate-source capacitance remains charged in this negative state and is refreshed by repeating the negative pulse after approximately 10 microseconds for instance.

Figure 4:
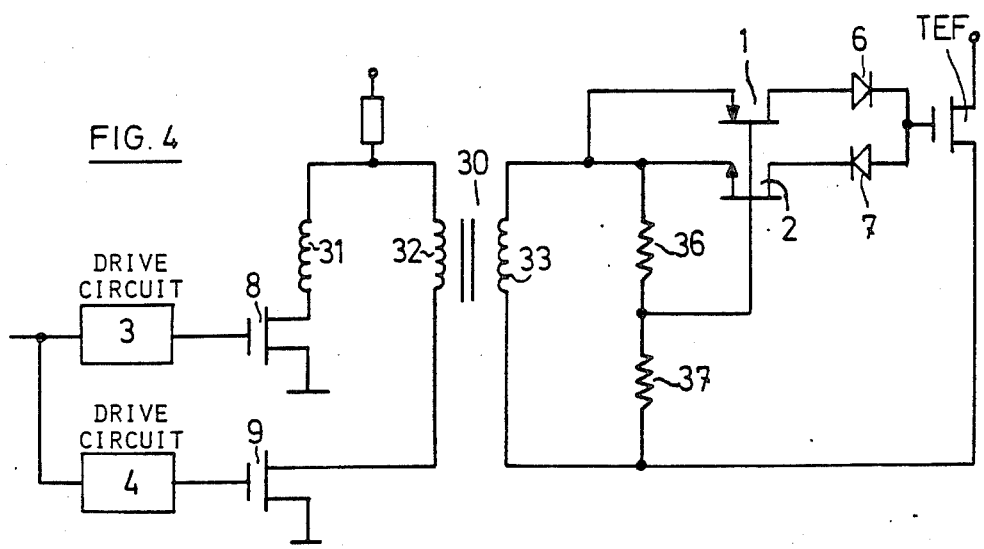
FIG. 4 shows a variation of the embodiment of FIG. 3.

FIG. 4 shows a variation of the embodiment of FIG. 3. Here the auxiliary secondary windings are eliminated. The transformer 30 only has one secondary winding 33 that is coupled to the primary windings 31 and 32. The base voltage for the transistors 1 and 2 is derived from the potentiometer formed by the resistors 36 and 37. The operation of the circuit of FIG. 4 is similar to that of FIG. 3.

What is claimed is:

1. A drive circuit for a power field effect transistor, comprising:
   a first switching circuit connected between the gate and source electrodes of said field effect transistor, said first switching circuit including
      a first pulse transformer having a primary winding and first and second secondary windings; and
      a first transistor having its drain and source connected in series with the first secondary winding of said first pulse transformer, said series-connected first transistor and first secondary winding of said first pulse transformer being connected between the gate and source electrodes of said field effect transistor, the second secondary winding of said first pulse transformer being connected between the gate and source of said first transistor;

a second switching circuit connected between the gate and source electrodes of said field effect transistor, said second switching circuit including
  a second pulse transformer having a primary winding and first and second secondary windings; and
  a second transistor having its drain and source connected in series with the first secondary winding of said second pulse transformer, said series-connected second transistor and first secondary winding of said second pulse transformer being connected between the gate and source electrodes of said field effect transistor, the second secondary winding of said second pulse transformer being connected between the gate and source of said second transistor;

a first pulse generator coupled to the primary winding of said first pulse transformer, said first pulse generator, in response to an input signal, producing positive voltage pulses at a predetermined rate across the first and second secondary windings of said first pulse transformer, the voltage pulses across the second secondary winding of said first pulse transformer turning said first transistor ON and OFF, and the voltage pulses across the first secondary winding of said first pulse transformer charging the gate-source capacitance of said field effect transistor to the open circuit source voltage of said first pulse transformer thereby turning said field effect transistor ON; and a second pulse generator coupled to the primary winding of said second pulse transformer, said second pulse generator, in response to said input signal, producing negative voltage pulses at a predetermined rate across the first and second secondary windings of said second pulse transformer, the voltage pulses across the second secondary winding of said second pulse transformer turning said second transistor OFF, and the voltage pulses across the first secondary winding of said second pulse transformer charging the gate-source capacitance of said field effect transistor to a negative voltage thereby turning said field effect transistor OFF.

2. The circuit of claim 1 which further comprises first and second diodes connected in series with said first and second transistors respectively.

3. The circuit of claim 1 wherein an inverter is coupled to the input of said second pulse generator, said inverter inverting said input signal for application to the input of said second pulse generator.

4. The drive circuit for a power field effect transistor, comprising a pulse transformer having first and second primary windings and a secondary winding;

first and second transistors coupled between one end of the secondary winding of said pulse transformer and the gate electrode of said field effect transistor, the other end of said secondary winding being connected to the source electrode of said field effect transistor;

switching means coupled between the gate and source electrodes of each of said first and second transistors and to said pulse transformer;

a first pulse generator coupled to the first primary winding of said pulse transformer, said first pulse generator, in response to an input signal, producing positive voltage pulses at a predetermined rate across the gate and source electrodes of said first transistor, the voltage pulses across the gate and source electrodes of said first transistor turning said first transistor ON and OFF, and the voltage pulses across the secondary winding of said pulse transformer charging the gate-source capacitance of said field effect transistor to the open circuit source voltage of said pulse transformer thereby turning said field effect transistor ON; and a second pulse generator coupled to the second primary winding of said pulse transformer, said second pulse generator, in response to said input signal, producing negative voltage pulses at a predetermined rate across the gate and source electrodes of said second transistor, the voltage pulses across the gate and source electrodes of said second transistor turning said second transistor OFF, and the voltage pulses across the secondary winding of said pulse transformer charging the gate-source capacitance of said field effect transistor to a negative voltage thereby turning said field effect transistor OFF.

5. The circuit of claim 4 wherein said switching means comprises first and second auxiliary secondary windings of said pulse transformer.

6. The circuit of claim 4 wherein said switching means comprises first and second series-connected resistors coupled across the secondary winding of said pulse transformer, the junction of said series-connected resistors being connected to the gate electrodes of said first and second transistors.

7. The circuit of claim 5 which further comprises first and second diodes connected in series with said first and second transistor respectively.

8. The circuit of claim 6 which further comprises first and second diodes connected in series with said first and second transistor respectively.

9. The circuit of claim 4 wherein said first and second pulse generators include third and fourth transistors for selectively coupling said first and second drive circuits to the first and second primary windings of said pulse transformer, respectively.

* * * * *